US007013244B2

(12) United States Patent
Cherkassky

(10) Patent No.: US 7,013,244 B2
(45) Date of Patent: Mar. 14, 2006

(54) METHOD AND SYSTEM FOR ESTIMATION OF QUANTITIES CORRUPTED BY NOISE AND USE OF ESTIMATES IN DECISION MAKING

(76) Inventor: Dmitry Cherkassky, 10 Hancock Ct., Voorhees, NJ (US) 08043

( * ) Notice: Subject to any disclaimer, the term of this patent is extended or adjusted under 35 U.S.C. 154(b) by 60 days.

(21) Appl. No.: 10/776,561

(22) Filed: Feb. 10, 2004

(65) Prior Publication Data

US 2004/0215425 A1 Oct. 28, 2004

Related U.S. Application Data

(60) Provisional application No. 60/446,229, filed on Feb. 10, 2003.

(51) Int. Cl.
*H03F 1/26* (2006.01)

(52) U.S. Cl. .................................................... 702/189

(58) Field of Classification Search ................ 702/189, 702/185, 170; 375/362, 147; 704/273; 701/214; 600/493, 496, 494; 340/825; 438/122; 381/314

See application file for complete search history.

(56) References Cited

U.S. PATENT DOCUMENTS

2002/0159553 A1 * 10/2002 McCarty et al. ............ 375/362

OTHER PUBLICATIONS

Nelson, W. "Minimax Solution of Statistical Decision Problems by Iteration", The Annals of Mathematical Statistics, 37:1643-1657.

* cited by examiner

*Primary Examiner*—John Barlow
*Assistant Examiner*—Tung S. Lau

(57) ABSTRACT

An automated system and a method for estimating quantities from their measured values, incorporating these estimates into decision making processes, and combining these estimates with other available knowledge (e.g. statistical, physical and logical models) are provided. Estimation is performed by utilizing finite compact representations to capture the structure of continuous or large discrete problems, allowing efficient computation of decision rules. The representations are exact, so the resulting solutions are not approximations. Decision making is accomplished by selecting decisions based on the task to be completed, results of the estimation, and any available knowledge.

28 Claims, 5 Drawing Sheets

METHOD AND SYSTEM FOR ESTIMATION OF QUANTITIES CORRUPTED BY NOISE AND USE OF ESTIMATES IN DECISION MAKING

RELATED APPLICATION

This application claims benefit of U.S. Provisional Application No. 60/446,229, filed Feb. 10, 2003, the entirety of which is incorporated herein by reference.

STATEMENT REGARDING FEDERALLY SPONSORED RESEARCH AND DEVELOPMENT

The U.S. Government has a paid-up license in this invention and the right in limited circumstances to require the patent owner to license others on reasonable terms as provided for by the terms of Grant No. DAAH01-96-1-0007 awarded by Army Research Office and Grant No. DABT63-99-1-0017 awarded by DARPA.

BACKGROUND OF THE INVENTION

Systems interacting with the real world usually take noisy measurements of relevant variables, try to estimate the true values of these variables, and make decisions based on the estimates, as well as available statistical, physical and logical models. A graphical representation of a typical system is shown in FIG. 1. As shown in this figure, the estimator 11 combines noisy measurements from sensors 10 with the information available from the prior iterations of the system's execution and statistical information about the measurement noise in order to come up with the estimates of the true values of the measured variables. The decision maker 12 uses these estimates and physical models to make decisions.

We refer to any quantities of interest to the system as state variables. For typical applications these variables may be related to the environment, the system, the system's tasks, and any other cooperating and competing systems. All possible values for state variables form the state space. The system is able to take measurements of some of the state variables using physical and/or virtual sensors. Such measurements are usually corrupted by noise. Estimation is the process of selecting optimal values for measured state variables utilizing measurements, statistical information about noise, any prior statistical information about state variables, and any restrictions on possible values of the state variables. Although estimation may be a system's sole task, often estimates are utilized in further decision making. A system's decisions may affect a subset of state variables. Decisions are made to accomplish tasks. Tasks may be specified by constraints on the state space that define target Subsets.

Such systems have a wide variety of applications. Two representative examples are controllers and prognostic systems. In the first example, a controller may generate control policies for an autonomous robotic system. The system uses its sensors to take noisy measurements of the environmental and system's state variables. The controller computes the control law to be used over the next control loop iteration based on these measurements, previous state estimates, and models. In the second example, the system monitors parts (e.g. gears, actuators, pumps, etc.) by taking measurements of their states and reasoning about their remaining useful life and any required maintenance actions.

PRIOR ART

Currently, there are many approaches applied to such problems. They can be roughly divided into three groups: unstructured methods that process noisy measurements with no regard for models for the problem at hand, methods that fundamentally combine statistical estimation with the knowledge of the physical models, and methods that separate the estimating process based on statistical models from the reasoning stage based on physical and logical models.

Methods belonging to the first group, such as applications of neural networks, use sets of input data with known answers to build a representation of the knowledge captured by these sets of data. The resulting representation serves as the input-output model for the problem being solved. Any structured knowledge about the problem, such as physical, statistical and logical models is not used.

Methods belonging to the second group handle estimation and decision making problems in a combined approach by closely coupling statistical and physical models. Typical examples of such approaches are time series analysis and the Kalman filter. These methods make assumptions about dynamics of behavior and statistical distributions, such as linearity and normality, to achieve theoretically optimal results.

Methods belonging to the third group separate the problem into two independent subproblems, estimation and decision making. The estimation may be performed using a variety of statistical approaches. Maximum likelihood estimation and Bayesian analysis are two examples of widely used methods. Maximum likelihood estimators examine the probability of collected measurements for possible values of measured quantities and choose the values of these quantities that maximize such probability as estimates. In Bayesian analysis, estimates are computed using noisy measurements, probability distributions of noise processes, and prior probability distributions on the quantities being estimated. Once the estimates are computed, they are used as inputs for the reasoning process. Typically, the estimates are handled as if they were true values, although sometimes variances of the relevant statistical distributions are taken into account. For instance, the estimated values, and in some cases their variances, may be propagated through physical models.

All the methods known in the prior art have shortcomings, which limit their applicability. One common limitation of all these methods is their inability to provide guarantees of their performance, a property essential to the end user and for the integration of results into further decision making analysis.

Methods such as neural networks generally ignore existing expert knowledge about the problem at hand. Instead, they rely entirely on being trained using large data sets with known answers. For many applications, such data sets are expensive or impossible to obtain. For other applications, it is impossible to verify that all possible operational cases, especially low probability events, are covered by the training data sets. Additional shortcomings include inability of the system to adjust to its current task at run-tine; having to obtain new training data sets and retrain the system with every configuration change; inability to formally reason about results at run-time; difficulties in meaningfully fusing results with other information; difficulties with integrating existing components into complex systems (e.g. because of changes in behavior due to integration); and inability to reason about performance and automatically detect failures at run-time.

Major shortcomings of the methods like time series analysis and the Kalman filter are the restrictions they place on the statistical and physical models. While they provide theoretically optimal solutions, in practice most real systems do not satisfy the required assumptions. Improvements, such as the Extended Kalman Filter, address some of these shortcoming, but still are not adequate to be applied in general cases when noise distributions are not normal and/or dynamics are highly non-linear. Furthermore, these improvements are approximations of optimal solutions and it is often difficult to evaluate the difference between these approximations and the optimum. In addition, all of these methods do not easily incorporate restrictions on the values of state variables, such as bounds on their ranges, often the most widely available type of information.

Approaches that separate estimation tasks from other processes have the advantage of being able to use advanced statistical methods most applicable to the problem at hand. Most widely used statistical tools are maximum likelihood estimation and Bayesian analysis. Maximum likelihood estimation is often inadequate because it ignores any available prior statistical information about the variables being estimated and does not provide a true measure of its performance (e.g. no probability of correctness associated with the result). Bayesian estimation addresses both of these shortcomings, but requires precise knowledge of the prior distribution, which is difficult or impossible to obtain. In addition, computation of Bayesian results in certain situations may be difficult. If there is only partial prior information available, Gamma-minimax estimation may be used. Minimax estimation is applicable when no prior information is available. Before now, both of these methods have not been widely used due to extreme computational difficulties. W. Nelson, “Minimax Solution of Statistical Decision Problems by Iteration”, The Annals of Mathematical Statistics, 37:1643–1657, December 1966, presents an iterative process for solving minimax decision problems. However, the process is applied to simple finite problems and until this invention, it was not utilized to solve continuous minimax problems. A further shortcoming of prior estimation methods is their inability to intelligently handle interactions between continuous and discrete phenomena. Even the basic task of space quantization is typically done in ad-hoc ways. When formal approaches are used, spaces are quantized in ways that define discrete problems that are only approximations to original continuous problems. In addition, once the estimates are computed, they need to be incorporated into the decision making process. Prior approaches address this problem in inadequate simplistic ways. One common method simply propagates point-valued estimates through physical models.

BRIEF SUMMARY OF THE INVENTION

We describe methods and systems for estimating quantities corrupted by noise, incorporating estimates into decision making processes, and designing systems that perform estimation and decision making tasks.

Estimation is performed using a novel method that represents continuous and large discrete statistical decision problems by exact compact finite representations that fully capture the structure of the original problem. They compute exact solutions and not approximations. These estimators support incorporation of restrictions on ranges of state variables being estimated. They also support use of the zero-one loss function, as well as Bayes, Gamma-minimax and minimax optimality criteria. They enable output in the confidence set format and guaranteed performance. Furthermore, they can be rigorously incorporated into hybrid systems, which are systems that involve interactions between discrete and continuous phenomena. These estimators are task-driven, in the sense that they can accept task requirements as inputs. They are ideal for supporting information fusion and for integration into decision making processes.

Decision making processes are performed using a novel method that computes decisions based on information about state variables represented as confidence sets. Such information may be obtained from the estimators described in this invention. In addition to incorporating information in the form of confidence sets, this method is capable of fusing information from various sources, as well as integrating information about effects of possible decisions on state variables, for example, in the form of physical, logical and statistical models. Furthermore, it is capable of integrating non-statistical restriction information about state variables, model parameters, and errors in decision implementations. It supports incorporation of costs of resources, performance specifications and task specifications, and enables guaranteed performance. This method can be utilized to build a novel iterative system for decision making under uncertainty in situations where decisions at previous iterations affect measurements at future iterations.

This invention enables definition of a framework for formal design and implementation of decision making systems and methods. Since state estimation and decision making systems based on this invention can guarantee their performance and are task-driven, a system can be built to calculate trade-offs between various design decisions, evaluate design choices, and automate the design processes.

DETAILED DESCRIPTION OF THE INVENTION

Estimation

Figure 1:
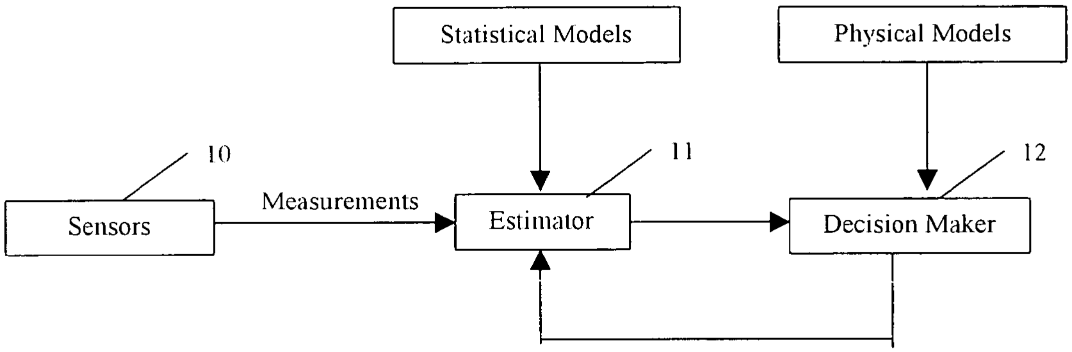
FIG. 1 shows a block diagram of an estimation and decision making system of the prior art.

Many computer applications involve data items corrupted by noise. Sources of such noisy measurements include physical and virtual sensors. Physical sensors include devices whose purpose is to output one or more measurements based on properties associated with monitored objects. Virtual sensors include devices and software modules that produce one or more measurements based on computations or data processing. For example, measurements can be computed based on outputs of physical sensors or generated through simulations. A software module may be a set of instructions executed by a computer or an analog or digital signal representing computer code. A computer may be, but is not limited to, an embedded microprocessor, a general-purpose computer, any other device capable of performing analog, digital or quantum computation, or a plurality of computers networked together.

We sometimes refer to original uncorrupted data items as state variables. There may be additional state variables that are not measured, but are of interest for a particular problem. The set of all values that a state variable can assume is called the state space of the variable. The Cartesian product of state spaces for all state variables is called the state space. Estimation takes measurements as inputs and utilizes other available information to estimate optimal values for state variables. Thus, estimation may be viewed as a function that depends on an optimality criterion and available information, takes measurements as inputs, and produces estimates as outputs. Such functions are often called decision rules. Depending on the number of and relationships between state variables and measurements, as well as optimality criteria being used, estimation may be a very difficult task to accomplish.

This invention achieves significant advantages over methods known in the prior art by representing estimation problems with complex state spaces (continuous or large discrete spaces) by equivalent estimation problems with the state space for at least one state variable replaced by a finite state space. These finite representations are not approximations. They are exact representations capturing the fundamental structure of the original problem. Decision rules for the original problem can be computed by computing decision rules for the representation and extending results. In one embodiment of this invention, the representations are compact (containing relatively few points) and minimal (no point in the state space of the representation can be removed without affecting exactness).

Finite state spaces simplify computation of decision rules. This invention enables solutions to decision problems that methods known in the prior art have not been able to solve. Compactness of representations enables efficient computation of decision rules making this invention applicable to situations where there are constraints on computational resources or time available for computation, for example embedded real-time applications. Furthermore, decision rules for problems with finite state spaces are typically piecewise constant functions, which can be efficiently stored and applied. For some applications, the rules can be pre-computed and stored for run-time use with minimal utilization of data storage resources.

There is a variety of methods known in the prior art that utilize Bayes decision rules for estimation. This invention enables the use of decision rules, which are based on other optimality criteria. Bayes rules can be applied when prior probability distributions for state spaces of state variables are available. Often this information is difficult or impossible to obtain. For problems with finite state spaces Gamma-minimax and minimax decision rules may be computed. In one embodiment of this invention, minimax decision rules are calculated by applying the method described in W. Nelson, "Minimax Solution of Statistical Decision Problems by Iteration", The Annals of Mathematical Statistics, 37:1643–1657, December 1966. In particular, solutions are found for previously unsolved minimax decision problems with continuous state spaces by computing decision rules for their finite representation problems and extending the resulting rules. In another embodiment of this invention, Nelson's method is extended to Gamma-minimax decision problems. Minimax estimation can be applied when there is no prior statistical information available about state variables. Gamma-minimax estimation can be applied when partial prior statistical information about state variables is available. For example, such information may be in the form of an envelope of probability distributions. When such information can be represented by bounds on probabilities for the points in a finite representation problem, an extension of Nelson's method can be applied to compute Gamma-minimax decision rules because the set of possible priors forms a convex subset of the set of all priors. Thus, optimization can be performed following the same method, but restricting its range to prior probability distributions constrained by known information.

Through its use of finite representations, this invention enables the incorporation of a variety of different loss functions into the estimation process. For example, one embodiment of this invention uses the squared-error loss, which is a common loss function used in estimation applications throughout the prior art. Another embodiment of this invention uses the zero-one loss function (a function whose value is 0 if the estimate is within a certain distance from the true value and 1 otherwise). Ability to use this loss function is of great benefit for many applications because the risk of the corresponding decision rules is equivalent to the probability of failure, leading to estimates in the confidence set format. Unfortunately, it is greatly underused due to decision rule computation difficulties encountered by the methods known in the prior art. Since estimates are usually computed in order to be used in decision making processes, it is beneficial to have their output in a format that supports such use.

This invention enables computation of decision rules for applications with a variety of noise distributions. One embodiment of this invention computes decision rules when the noise distribution possesses the Maximum Likelihood property (this includes Gaussian noise). Another embodiment of this invention computes decision rules when the noise distribution is Cauchy. In general, finite representation problems can be solved for an extremely wide range of noise distributions and in many cases for situations when noise distributions are not precisely known, such as when noise distributions are only known to belong to a class or envelope of distributions.

A further advantage of this invention is its ability to incorporate restrictions on the values of state variables. In fact, bounds on these values are required to compute finite representations and obvious bounds are easily obtained from application contexts (e.g. obvious bounds on distance and velocity). When meaningful restrictions are available from coarse sensors, computation, geometry, logical rules, state space constraints, previous iterations of decision making systems (when decisions affect state variables) and other sources, their incorporation can significantly improve estimates. In many applications, this is the most widely available type of information.

A further advantage of this invention is the ability of its estimators to guarantee their performance. Although optimal in theory, the methods known in the prior art do not provide performance guarantees. This is due to the fact that they do not formally handle deviations from assumptions. For example, most of the prior art estimators use Bayesian optimality criterion and squared-error loss. When prior probability distributions required for Bayesian methods are not fully known (which is the case for most problems of interest) estimators are not optimal. Estimators described herein provide performance guarantees by utilizing Bayesian estimation when prior probability distributions are fully known, Gamma-minimax estimation when partial prior information is available, and minimax estimation when no prior information is available. Furthermore, decision rules that are theoretically optimal for continuous problems remain optimal when implemented in embodiments of this invention because finite problems solved computationally within these embodiments are exact representations and not approximations.

In one embodiment of this invention, decision rules are based on the zero-one loss function leading to estimates in the form of confidence sets. An advantage of this invention over methods known in the prior art is that such estimators can be task-driven. If the estimation is performed to accomplish a certain task, either the required minimal level of confidence, maximal size of the confidence set or both can be determined from the task specification. If a decision rule that satisfies these requirements cannot be computed, it can be determined automatically that the task cannot be accomplished. In addition, the reason for the failure and the steps required to rectify it can be determined.

A further advantage of this invention is that it enables rigorous handling of interactions between discrete and continuous phenomena. Systems involving such interactions are called hybrid systems. Applications of such systems can greatly benefit from formal analysis supported by this invention through the use of finite exact representations capturing fundamental properties of continuous problems. For example, one embodiment of this invention supports computation of optimal quantizations of continuous spaces.

In one embodiment of this invention, there is a plurality of measurements. There may be multiple measurements of the same state variable or multiple measurements of multiple state variables. If measurements are independent, estimation can be performed for each measured state variable separately. However, if there are dependent measurements, multidimensional decision rules have to be computed. This invention simplifies computation of such rules by using a cross product of finite spaces as the state space for a finite representation problem.

Set-Valued Minimax Estimation Embodiment Using the 0–1 Loss Function

Figure 2:
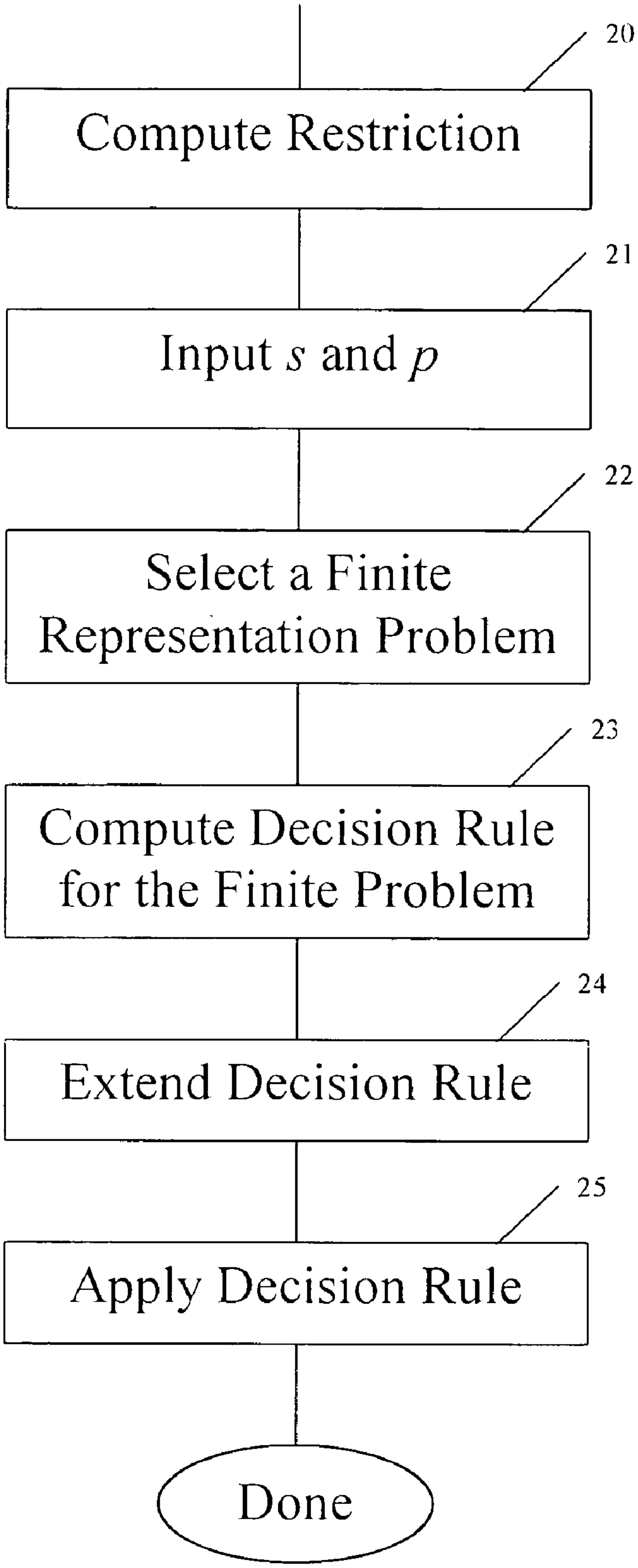
FIG. 2 shows a flowchart summarizing one estimation embodiment of this invention.

Estimation may be performed using the steps summarized in the flowchart in FIG. 2. These steps are as follows:

- Determine a restriction, S, on the state variable being estimated (Step 20).
  - For example, the state variable may represent the distance between two objects and this distance may be known to lie in the interval $[-d,d]$ due to geometric constraints.
- Determine the required size of the estimate, s, and the required level of performance, p (Step 21).
  - For example, both may be determined from the current task specification. Since there is a tradeoff between these two quantities, it is possible that the requirement cannot be satisfied.
- Determine the finite representation (Step 22).
  - For example, if the measurement is corrupted by the additive Cauchy noise, a finite representation containing $n=2\lceil 2d/s\rceil$ points may be computed. One possible representation is a decision problem with the state space of $\{-d^+, (d-(m-1)s)^-, (-d+s)^+, (d-(m-2)s)^-, (-d+2s)^+, \ldots, (-d+(m-1)s)^+, d^-\}$ where $m=n/2$ (for $n=6$, this becomes $\{-d^+, (d-2s)^-, (-d+s)^+, (d-s)^-, (-d+2s)^+, d^-\}$), the set of possible estimates $\{-d+e, -d+2e, \ldots 0, \ldots, d-2e, d-e\}$ where $e=s/2$ (for $n=6$, this becomes $\{-d+e, -d+2e, 0, d-2e, d-e\}$), and a slightly modified zero-one loss function defined for a possible estimate a by $L(a,t^+)=0$ if $t-s/2<a\leqq t+s/2$, $L(a,t^-)=0$ if $t-s/2\leqq a<t+s/2$ and $L(a,t^-)=L(a,t^+)=1$ otherwise. In this notation, the points $t^-$ and $t^+$ are treated differently from the point $t\in\mathfrak{R}$ only when the loss function L is applied, and are otherwise treated as t in all computations.
- Compute a minimax decision rule for the representation problem (Step 23).
  - The rule may be computed using Nelson's algorithm. Alternatively, a pre-computed rule may be used.
- Extend the decision rule to the original problem (Step 24).
- Apply the extended rule to the measurement to compute an estimate E (Step 25).

Figure 3:
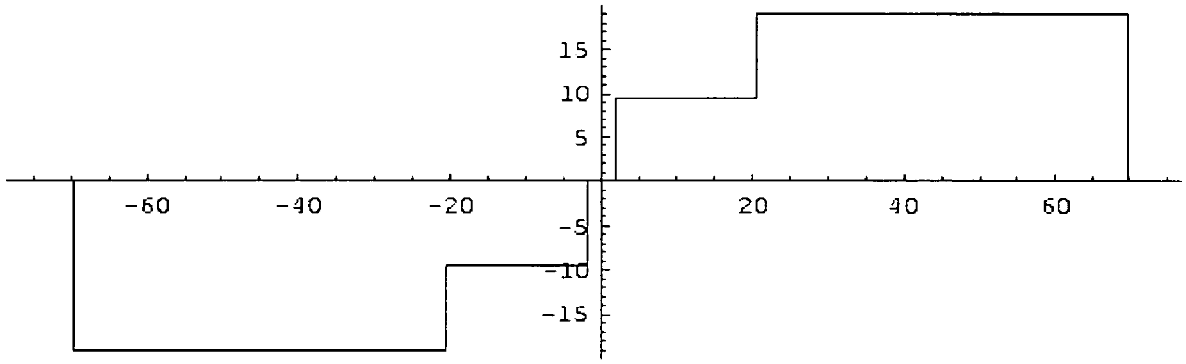
FIG. 3 shows a minimax decision rule for a finite representation problem for an estimation embodiment of this invention.
Figure 4:
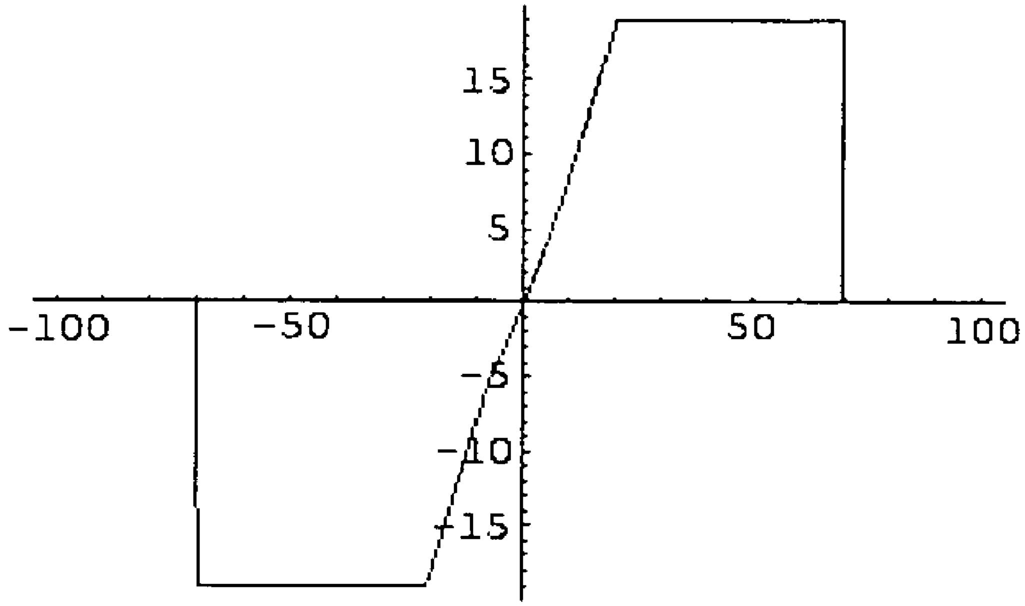
FIG. 4 shows an extended minimax decision rule for an estimation embodiment of this invention.

FIG. 3 depicts the minimax decision rule for the representation problem when $S=[-d,d]$, d is approximately 28.53 and $|S|/s=3$, and the noise is additive and has the standard Cauchy probability distribution. FIG. 4 depicts the extension of this rule to the original continuous problem. Note that the rule for the finite problem exactly captures the shape of the rule for the continuous problem with the switching points between classes of estimates being the same.

Decision Making

We describe a framework for decision making under uncertainty. Applications of this framework are enabled by a novel method for incorporating information represented in the form of confidence sets into decision making processes. This invention achieves significant advantages over methods known in the prior art by its novel use of confidence sets to encapsulate uncertain information. In one embodiment of this invention at least some of the confidence sets are obtained by using a state estimation system described herein. The estimators of this invention are ideal for integration into decision making because they can incorporate restrictions in the form of bounds on the values of state variables and can be adapted to the current task specification (decision rules can be computed based on the required size of resulting estimates and probabilities of success). Integration is further simplified due to the fact that confidence sets with complex shapes may be enlarged to sets with more manageable shapes. The action of enlargement does not reduce the level of confidence, so if all the values in the resulting set satisfy performance requirements, so would the original set.

Confidence sets guarantee that the values of state variables belong to them. This guarantee enables formal computation of decisions. One embodiment of this invention preserves this performance guarantee throughout the decision making process. This can be accomplished by representing all uncertain information in the form of confidence sets and all certain information in the form of sets. The estimates in the confidence set format may be propagated through physical and logical models for different possible decisions. Since models are typically not known exactly, model parameters can be represented by bounded sets. Since effects of some decisions may be in the form of real-world physical actions and such actions are imperfect (for example, due to wear-and-tear or imperfect manufacturing of actuators), effects of decisions may be represented by bounded sets as well. Since this method starts with guaranteed estimates and uses sets of values that are known to contain the true value of non-measured items at each step (or a confidence set), it ends up with a guaranteed result. If a set of decisions satisfies task requirements (which may include the required probability of success) as computed, it is guaranteed to satisfy task requirements as implemented. At run-time, situations may arise when task requirements cannot be satisfied. The system can automatically detect these situations and compute corrective actions. If unforeseen situations arise, where the system is able to compute decisions satisfying task requirements, but task requirements are not satisfied when these decisions are implemented, this invention supports discovery of the discrepancy and intelligent recovery.

A further advantage of this invention is its ability to flexibly incorporate task requirements into the decision making process. In one embodiment of this invention, tasks are determined by a task planning module. Complex tasks may be broken up into sequences of basic tasks. From task specification, the system can compute task requirements and if every module, including estimators, guarantees its performance, the system can compute an optimal plan for the use of its modules and resources. If the cost of resources is specified or can be computed, such cost can be incorporated into computations. If the cost of actions is specified or can be computed, such cost can be incorporated into computations.

A further advantage of this invention over the methods known in the prior art is its ability to represent all available information in the common format of bounded sets. For stochastic quantities, such as estimates or some values of state variables affected by decisions, these sets are confidence sets with attached confidence probabilities. For non-stochastic quantities, such as information about unmeasured state variables (which may or may not be affected by decisions) these sets are known bounds on their values. Even imperfect knowledge of noise distributions can be handled by using envelopes of distributions. Available information may commonly include estimates based on measurements from sensors, known bounds on measured quantities, known bounds on unmeasured quantities, bounds on parameters in dynamic models (if physical models are used in the decision process), bounds on task specifications (tasks can be specified as target subsets of variables affected by decisions), and bounds on effects of decisions.

Information fusion is arguably one of the hardest tasks for decision making systems. This invention provides the framework that facilitates combining various types of information due to the simple, yet rigorous, representation of information. The common format, combined with formal estimators grounded in statistical decision theory, enables fusion of information from various system components and different systems. This property makes this unified framework ideal for assembling complex systems from heterogeneous components and for implementing cooperative systems. At the same time, its ability to support minimax decision rules makes it ideal for implementing systems competing against adversaries.

Example of an Iterative Decision Making Embodiment

Figure 5:
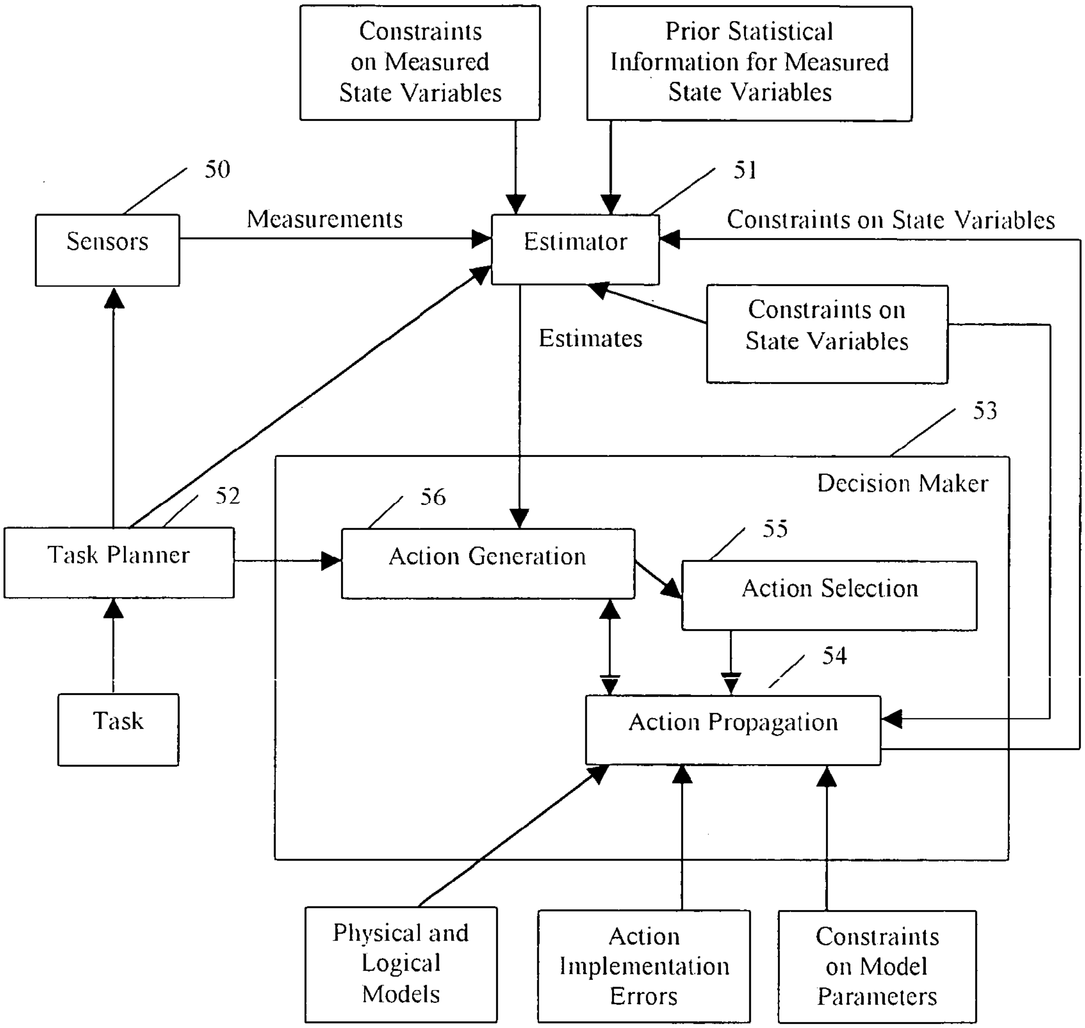
FIG. 5 shows a block diagram of an example of an improved estimation and decision making system of the current invention.

This invention defines a framework for making decisions under uncertainty. While this framework can be used to make single iteration decisions, its advantages over methods known in the prior art are fully brought to light when applied to iterative decision making processes. Such an embodiment is shown in FIG. 5, which is a block diagram of an iterative decision making system. In this embodiment, a set of sensors (physical or logical) 50 may take a set of noisy measurements, which are processed by the estimating module 51. The estimator 51 may use information about constraints on the ranges of measured quantities and any prior statistical information about their distributions, if available, to compute confidence set-valued estimates. The task planning module 52 may determine the performance for the current iteration required to accomplish the task and decide which sensors should be used based on the performance they support and the cost of using them (time, resources, operational constraints, etc.), as well as the required frequency of iterations. If the required performance cannot be achieved, the system is able to automatically detect the failure and react to it. Computed estimates, together with any knowledge of the bounds on the ranges of non-measured quantities involved in the decision making process, may be utilized by the action generation component 56 of the decision maker 53 to select a set of actions that keep quantities affected by system's decisions within bounds specified by the task planner 52. This may be accomplished by the action propagation component 54 of the decision maker 53. This component may use dynamic and/or logical models combined with known bounds on the ranges of model parameters and known bounds on the ranges of effects of actions. If no action satisfying task requirements can be found, the system will detect the failure and react to it. From the computed task-conforming set of actions, the action selection component 55 may select an action based on its cost and other optimality criteria (e.g. passenger comfort in an aircraft, wear-and-tear minimization, etc.). The action propagation component 54 may compute the set of possible values at the time of the next iteration for quantities affected by the decision. This set, together with similar sets from other iterations, may be used to determine if the iteration frequency has to be adjusted and as an optional input to the estimating module 51 to further constraint ranges of measured quantities at the next iteration.

USE OF THE INVENTION

Some examples of application areas impacted by this invention are as follows:

Control Law Generation. This invention supports control law generation for a variety of systems including autonomous robotic systems and embedded controllers.

Condition Based Maintenance. This invention supports monitoring of mechanical components, health assessment, prognostic reasoning and maintenance planning.

Financial Planning. This invention supports decision making based on imperfect knowledge of financial data and future events affecting values of investments.

System Integration. This invention provides a common framework for integrating heterogeneous components.

System Cooperation. This invention provides a common framework for information exchange and task performance by cooperative systems.

Competitive Systems. This invention is founded in the statistical decision theory and supports minimax decision making. It is ideal for applications that involve competing and adversarial systems.

Hybrid Systems: This invention provides a framework for rigorous design and implementation of systems involving interactions between continuous and discrete phenomena.

System Design. This invention supports a rigorous system design process. Given a set of task specifications (including performance requirements), this invention supports reasoning about required resources and components, such as sensors, actuators and algorithms. It clearly exposes inherent tradeoffs between design costs (including length of design process and model building efforts), implementation costs, performance, sensor accuracy, actuator accuracy, and computational requirements.

While this invention has been particularly shown and described, all examples, applications and referenced embodiments are for explanation and illustration purposes only. It will be understood by those skilled in the art that various changes in form and details may be made therein without departing from the scope of the invention encompassed by the appended claims.

What is claimed is:

1. A state estimation system for determining possible values of a measured data item comprising:
 a computer;
 at least one measurement input to the computer measuring the data item, said measurement corrupted by noise;
 a computer output device;
 at least one restriction on the measured data item, said restriction available in memory to the computer; and
 a software module operating on the computer for calculating at least one estimate of the state of the measured data item based upon the measurement input and the restriction, and sending the estimate to the output device;
 wherein the software module calculates the estimate by:
  representing the state space of the measured data item as a finite set of points using the restriction;
  computing a first decision rule based upon the finite set of points;
  computing a second decision rule by extending the first rule to include additional points within the state space of the measured data item; and
  applying the second decision rule to the measurement input.

2. The system of claim 1 wherein the decision rule is minimax, Bayes or Gamma-minimax.

3. The system of claim 1 wherein prior statistical information about the measured data item is available in memory to the computer, and the decision rule uses the statistical information.

4. The system of claim 1 wherein the measured data item is comprised of a plurality of values.

5. The system of claim 1 wherein the decision rule is based upon a loss function.

6. The system of claim 5 wherein the loss function is zero-one or squared-error.

7. The system of claim 1 wherein the estimate forms a confidence set.

8. The system of claim 1 wherein the output device is a second software module.

9. A system for making decisions related to a task comprising:
 a computer;
 a task definition available to the computer in memory;
 a description of possible decisions available to the computer in memory;
 a description of effects of the possible decisions on a second state variable, the description of effects available to the computer in memory, said effects dependent on the value of the first state variable;
 a computer output device;
 a software module operating on the computer for making decisions based on the task definition, the possible decisions and the description of effects, and sending the decision to the output device;
 wherein the software module selects at least one decision from the possible decisions by:
  computing a restriction on the value of the first state variable;
  computing a confidence set describing the value of the first state variable, while performing the computation based on the restriction;
  performing calculations on the effects of possible decisions on the second state variable, while restricting the calculations based upon the confidence set; and
  evaluating values resulting from the calculations for compatibility with the task definition.

10. The system of claim 9 wherein the confidence set is computed using a state estimation system.

11. The system of claim 9 wherein the first state variable and the second state variable are each a vector comprised of at least one variable.

12. The system of claim 11 wherein some or all of the variables in the first vector are the same as some or all of the variables in the second vector.

13. The system of claim 9 wherein there is additional stochastic information available about the value of the first state variable, and said stochastic information and the information contained in the confidence set is fused.

14. The system of claim 9 wherein the output device is a second software module.

15. A state estimation method for determining possible values of a measured data item using a computer to perform the following steps:
 reading at least one measurement corrupted by noise;
 determining at least one restriction on the measured data item;
 calculating at least one estimate of the state of the measured data item based upon the measurement and the restriction by:
  representing the state space of the measured data item as a finite set of points using the restriction;
  computing a first decision rule based upon the finite set of points;
  computing a second decision rule by extending the first rule to include additional points within the state space of the measured data item; and
  applying the second decision rule to the measurement input; and
 sending the estimate to an output device.

16. The method of claim 15 wherein the decision rule is minimax, Bayes or Gamma-minimax.

17. The method of claim 15 wherein prior statistical information about the measured data item is available in memory to the computer, and the decision rule uses the statistical information.

18. The method of claim 15 wherein the measured data item is comprised of a plurality of values.

19. The method of claim 15 wherein the decision rule is based upon a loss function.

20. The method of claim 19 wherein the loss function is zero-one or squared-error.

21. The method of claim 15 wherein the estimate forms a confidence set.

22. The method of claim 15 wherein the output device is a software module.

23. A method for making decisions related to a task using a computer to perform the following steps:
 reading a task definition;
 reading a description of possible decisions;
 reading a description of effects of the possible decisions on a second state variable, said effects dependent on the value of the first state variable;
 selecting at least one decision based on the task definition, the possible decisions and the description of effects by:
  computing a restriction on the value of the first state variable;
  computing a confidence set describing the value of the first state variable, while performing the computation based on the restriction;

performing calculations on the effect of possible decisions on the second state variable, while restricting the calculations based upon the confidence set; and evaluating values resulting from the calculations for compatibility with the task definition; and sending the selected decision to an output device.

24. The method of claim 23 wherein the confidence set is computed using a state estimation method.

25. The method of claim 23 wherein the first state variable and the second state variable are each a vector comprised of at least one variable.

26. The method of claim 25 wherein some or all of the variables in the first vector are the same as some or all of the variables in the second vector.

27. The method of claim 23 wherein there is additional stochastic information available about the value of the first state variable, and said stochastic information and the information contained in the confidence set is fused.

28. The method of claim 23 wherein the output device is a software module.

* * * * *